US005513192A

United States Patent [19]
Janku et al.

[11] Patent Number: 5,513,192
[45] Date of Patent: Apr. 30, 1996

[54] FAULT TOLERANT DISK DRIVE SYSTEM WITH ERROR DETECTION AND CORRECTION

[75] Inventors: Jan A. Janku, Atherton; Maarten Pranger, Morgan Hill, both of Calif.

[73] Assignee: Sun Microsystems, Inc., Mountain View, Calif.

[21] Appl. No.: 937,467

[22] Filed: Aug. 28, 1992

[51] Int. Cl.⁶ ..................................... G06F 11/10
[52] U.S. Cl. ..................... 371/50.1; 371/48; 371/49.1
[58] Field of Search ................... 371/50.1, 49.1, 371/48, 67.1, 71, 24, 7, 51.1, 40.1, 40.4, 37.4, 49.2, 37.7, 37.6, 21.2; 395/575

[56] References Cited

U.S. PATENT DOCUMENTS

| | | | |
|---|---|---|---|
| 3,685,016 | 8/1972 | Eachus | 371/50.1 |
| 4,201,976 | 5/1980 | Patel | 371/50 |
| 4,205,324 | 5/1980 | Patel | 371/50 |
| 4,456,980 | 6/1984 | Yamada et al. | 365/200 |
| 4,747,080 | 5/1988 | Yamada | 365/200 |
| 4,768,193 | 8/1988 | Takemae | 371/50.1 |
| 4,958,350 | 9/1990 | Wooley et al. | 371/37.4 |
| 5,185,746 | 2/1993 | Tanaka et al. | 371/40.1 |

FOREIGN PATENT DOCUMENTS

| | | | |
|---|---|---|---|
| 00-92498 | 6/1982 | Japan | 371/51.1 |
| 0175100 | 3/1984 | Japan | 371/51.1 |
| 0-241949 | 9/1989 | Japan | 371/49.1 |

*Primary Examiner*—Robert W. Beausoliel, Jr.
*Assistant Examiner*—Phung M. Ghung
*Attorney, Agent, or Firm*—Blakely, Sokoloff, Taylor & Zafman

[57] ABSTRACT

A fault tolerant, magnetic disk drive array with error detection and correction. The present invention performs vertical parity checks and one or two additional diagonal parity checks on a data stream as it is read into a disk drive array. The results of these "read-in" parity checks are stored in either two or three redundant disk drives. Upon read out of the data stream from the disk drive array, similar "read-out" parity checks are performed on the data. Based upon a comparison of the "read in" and read "out" vertical and diagonal parity checks, corrupted data can be detected and corrected.

13 Claims, 5 Drawing Sheets

FAULT TOLERANT DISK DRIVE SYSTEM WITH ERROR DETECTION AND CORRECTION

BACKGROUND OF THE INVENTION

1. Field of the Invention

The present invention relates to the field of disk drive devices in computer systems, and more particularly to fault tolerant arrays of magnetic disk drive devices.

2. Art Background

Computer systems often employ a disk drive device for the secondary storage and retrieval of large amounts of data. Disk drive devices, however, are subject to a number of possible failures which can compromise data. For example, certain tracks on a particular disk may be affected by defects in the magnetic recording media. Alternatively, data errors can be produced by the non-uniform flying height of the read/write head over the magnetic disk. Under certain circumstances, a problem referred to as "sticktion" can occur wherein the read/write head comes into contact with, and adheres to, the surface of the magnetic disk. Power outages can also cause spin-motor or servo-motor seizures. In a limited number of cases, the power supply or the controller board for a disk drive can fail completely, or a disk drive can lose functionality when the data is written onto the disk, but regain functionality when the data is read back. All of these potential failures pose a threat to the integrity of data. The extent of this threat is typically estimated by disk drive manufacturers and provided in the form of a Mean Time Between Failure (MTBF) figure, a figure which presently ranges anywhere from 20,000 and 100,000 hours.

In recent years, the failure rate for disk drives has taken on greater significance as an increasing number of systems have moved away from the use of a single, large, expensive disk toward the incorporation of an array of smaller, inexpensive disks. While an array of smaller inexpensive disks offers an improved data transfer rate and lower costs, it also poses significant reliability issues. In particular, if one assumes a constant MTBF, and that disk failures occur independently of one another, the reliability of an array of disks can be calculated according to the following equation: MTBF for disk array= MTBF of a single disk/number of disks in the array. From this equation, it will be appreciated that the MTBF for a disk array raises substantial reliability concerns.

A number of solutions have been proposed to resolve the problem of reliability in disk drive arrays. (See, for example, "A Case for Redundant Arrays of Inexpensive Disks (RAID)," David A. Patterson, Garth Gibson, and Randy H. Katz, Report No. UCB/CSD 87/391, Computer Science Division (EECS), University of California, Berkeley, December 1987.) One prior art solution utilizes a redundant disk for each data disk, and effectively mirrors all data on redundant disks. Although such a mirroring approach virtually insures data integrity, it is expensive and uses up to 50% of the system's total disk storage capacity to insure reliability. An alternative prior art solution utilizes Hamming Codes for error detection and correction. This solution, however, also utilizes a considerable number of redundant disks, and due to its complexity, cannot be done in real time in hardware.

As will be described, the present invention provides a method and apparatus for detecting and correcting disk drive failures in an array of disk drives which requires a minimal number of redundant disks. In addition, the implementation of the method and apparatus of the present invention is simple enough such that it can advantageously be accomplished in real time, in hardware.

SUMMARY OF THE INVENTION

A fault tolerant disc drive array with error detection and correction is disclosed. The present invention comprises an array of disk drives used to store data. In accordance with the present invention, parity checks are performed on the data in real time as it is being written into the array of disk drives. The results of these parity checks are then stored in redundant disk drives. When the data is read out of the array, the same parity checks are again performed on the data in order to detect possible data errors. Through comparison of the "read in" and "read out" parity checks, the specific bit positions of any errors can be identified. Moreover, for each data error detected, the specific disk drive which experienced the data error is also identified. To the extent that errors on this disk drive are detected with frequency, the disk drive can be targeted for replacement. Data errors, once detected, can be corrected by reconstructing the proper data values through reference to read-in parity check results and the remaining uncorrupted data.

The present invention can be implemented in conjunction with either two or three parity checks, yielding a corresponding redundancy of either two or three disk drives. A first embodiment uses two redundant parity check disk drives and is capable of detecting and correcting a single disk drive failure. In this embodiment, a vertical parity check and a diagonal parity check are performed. A second embodiment uses three redundant disk drives and is capable of detecting and correcting two disk drive failures. This embodiment performs, in addition to the previously described parity checks, an additional diagonal parity check. Thus, the present invention provides a simple, inexpensive, fault tolerant disk drive array which implements error detection and correction in real time.

BRIEF DESCRIPTION OF THE DRAWINGS

Further details are explained below with the help of the examples illustrated in the attached drawings in which.

DETAILED DESCRIPTION OF THE INVENTION

A fault tolerant disc drive array with real time error detection and correction is disclosed. In the following description, for purposes of explanation, numerous details are set forth such as specific array sizes, bandwidths, data paths, etc. in order to provide a thorough understanding of the present invention. However, it will be apparent to one skilled in the art that these specific details are not essential to the practice of the present invention. In particular, the present invention is in no way limited to the context of a disk drive array of a particular size, but finds general application in disk drive arrays comprising two or more data disks. It is further noted that well known electrical structures and circuits are shown in block diagram form in figures in order not to obscure the present invention unnecessarily.

Figure 1:
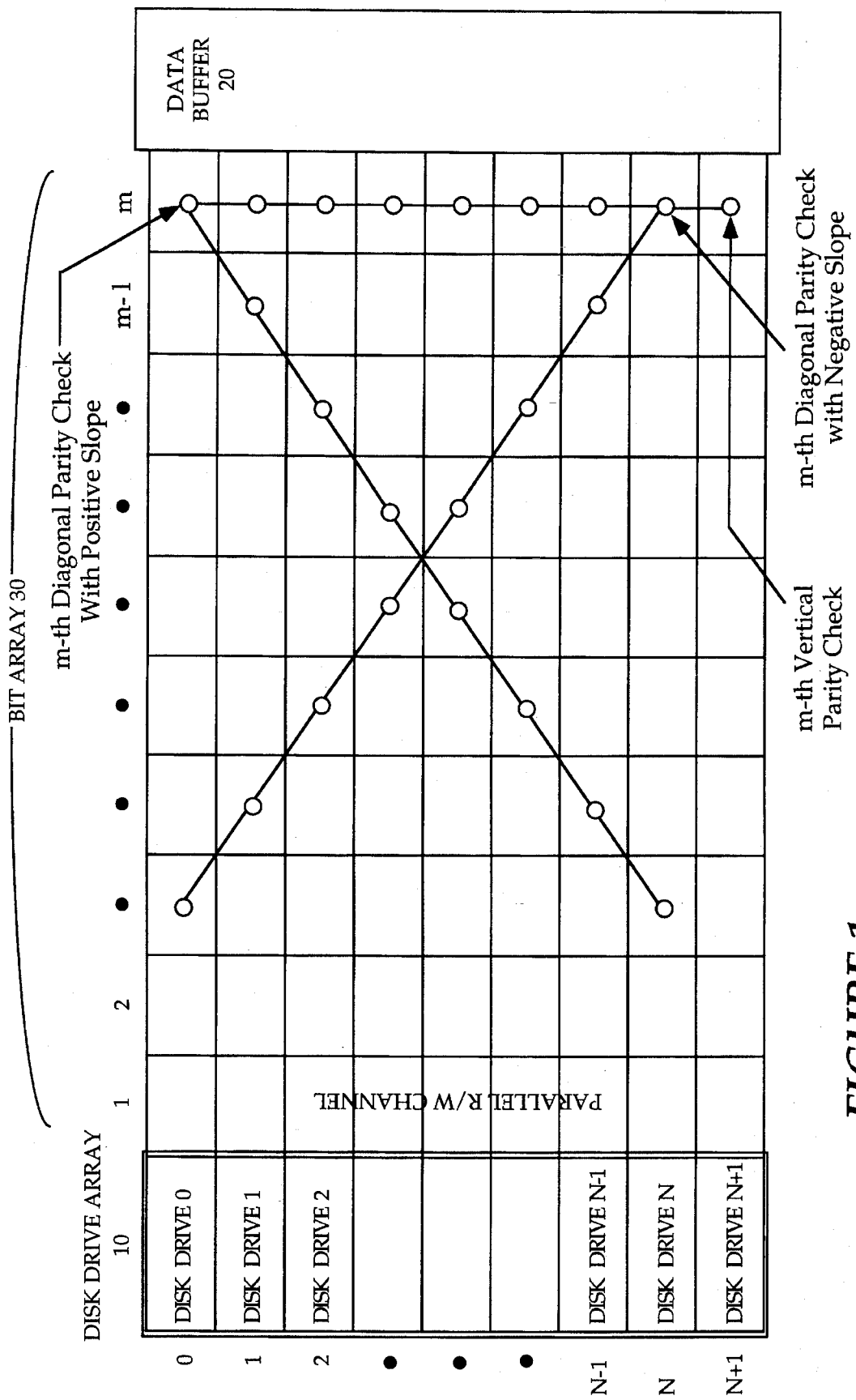
FIG. 1 illustrates the method and apparatus of the present invention.

Referring now to FIG. 1, the method and apparatus of the present invention is illustrated. In the present invention, data is coupled, in parallel, to a disk drive array 10. Disk drive array 10 comprises disk drive 0, disk drive 1, disk drive 2, and so on, up to disk drive N, and disk drive N+1. A data buffer 20 is also illustrated in FIG. 1. Data buffer 20 provides data to, and accepts data from, disk drive array 10. For purposes of illustrating the method of the present invention, a two dimensional bit array 30 is also illustrated in FIG. 1. In particular, the two dimensional bit array 30 represents an expanded view of a bit stream as it is being coupled between disk drive array 10 and data buffer 20. Across the top of the two dimensional bit array 30, the designations "1" to "m" correspond to time slots, each time slot corresponding to a clock cycle, while in the vertical direction of two dimensional bit array 30, separate bit channels are shown, one for each disk drive in disk drive array 10.

As will be described, the present invention utilizes either two or three redundant disk drives for error detection and correction. In accordance with the present invention, the use of two redundant disk drives provides for the detection and correction of a single failed disk drive, while the use of three redundant disk drives provides for the detection and correction of up to two failed disk drives. A general description of the present invention including a discussion of the use of three redundant disk drives will first be provided.

Referring again to FIG. 1, in the present invention, disk drives 1 to N−1 are reserved for data storage. In contrast, disk drive 0, disk drive N, and disk drive N+1 are redundant disks, utilized for error detection and correction. In particular, disk drive 0, disk drive N, and disk drive N+1 are used for the storage of parity check bits. Focussing first on disk drive N+1, this disk drive stores successive vertical parity check bits. With reference to the two dimensional bit array 30, each vertical parity check bit in channel N+1 represents the modulo-2 sum of the bits in the same bit position in each of the remaining channels. For example, as illustrated in FIG. 1, the check bit in channel N+1, for bit position m, is the result of the modulo-2 sum of the bits in each of the remaining channels in bit position m. Thus, the corresponding encoding equation for the m-th vertical parity check is:

$$Z_m(N+1) = \sum_{n=0}^{N} Z_m(n) \quad (1)$$

where the symbol $\Sigma$ indicates the modulo-2 sum.

Disk drive 0 stores successive positive slope diagonal parity check bits. In particular, each check bit stored in disk drive 0 represents the modulo-2 sum of the bits along a diagonal with a positive slope of one. As illustrated in FIG. 1, the positive slope diagonal parity check bit in channel 0, for bit position m, would be the result of the modulo-2 sum of the bits in the diagonal with positive slope as shown in this figure. The corresponding encoding equation for the m-th positive slope diagonal parity check is:

$$Z_m(0) = \sum_{n=0}^{N} Z_{m-n}(n) \quad (2)$$

Lastly, disk drive N contains successive negative slope diagonal parity check bits. In particular, each check bit in channel N represents the modulo-2 sum of the bits along the diagonal with a negative slope of one. For example, as illustrated in FIG. 1, the check bit in channel N, for bit position "m," would be the result of the modulo-2 sum of the bits in the diagonal with negative slope shown in this figure. Thus, the corresponding encoding equation for the m-th negative slope diagonal parity check is:

$$Z_m(N) = \sum_{n=0}^{N} Z_{m-n}(N-n) \quad (3)$$

The vertical parity check, the positive slope diagonal parity check, and the negative slope diagonal parity check, are generated in real time as data is coupled from the data buffer 20 to disk drive array 10. For example, if data from data buffer 20 is written to disk drive array 10, the data is initially striped into 1 to N−1 data channels, then coupled from data buffer 20 to disk drives 1 to N−1. As the data is being coupled from data buffer 20 to disk drive array 10, parity check bits are generated in real time and stored in disk drive 0, disk drive N, and disk drive N+1.

At the outset of a data transfer from data buffer 20 to disk drive array 10, the parity check bits are at least partly the product of initialized values. In particular, referring to FIG. 1, assume that data buffer 20 is writing data to disk drive array 10, and that bit position m contains the first bits to be written to disk drive array 10. In order to generate the positive slope diagonal parity check, and the negative slope diagonal parity check, initialized values (for example all zeros or all ones) for bit positions "1" to "m−1" in each of the channels are used. The negative slope parity check bit and the positive slope parity check bit are then calculated with these initialized values, and the vertical parity check bit in bit position "m" is then generated by taking the parity check of the 0 to N bits in bit position "m."

Accordingly, in the present invention, parity check bits are successively generated, such that the vertical parity check bits, the positive slope diagonal parity check bits, and the negative slope diagonal parity check bits, are sequentially stored in associated disk drives. In particular, the diagonal with positive slope parity check bits are sequentially stored in disk drive 0, while the diagonal with negative slope parity check bits are sequentially stored in disk drive N, and vertical parity check bits are sequentially stored in disk drive N+1. The data, itself, is sequentially stored in disk drives 1 to N−1.

When the data is read out of disk drive array 10, the data bits may be corrupted by errors. Accordingly, in the present invention, "read out" parity checks are conducted. These "read out" parity checks correspond to the parity checks conducted on the data when the data was written (or "read in") to disk drive array 10. The results of the "read out" parity checks are then compared to the corresponding results of the "read in" parity checks. The "read in" parity check results, it will be recalled, are stored in redundant disk drives 0, N, and N+1.

It will be appreciated that in the event the data is not corrupted by errors, the "read out" parity check bits will agree with the corresponding "read in" parity check bits. However, in the event the data is corrupted by errors, certain "read out" parity check bits will disagree with corresponding "read in" parity check bits. In particular, for each bit error in the data, a vertical parity check disagreement, a positive slope diagonal parity check disagreement, and a negative slope diagonal parity check disagreement will be detected. From the cross section of these parity check disagreements, the precise location of the single bit error can be identified. In the event that a particular disk drive has experienced substantial failure, this fact can also be detected as the bits in a particular channel will be found to be repeatedly corrupted. In such an event, the system user is signalled, and the disk drive is replaced.

As noted earlier, for the detection and correction of errors resulting from the failure of a single disk drive, only two parity checks, a vertical parity check and a single diagonal parity check are needed to detect the precise location of the errors resulting from the failure. In a number of systems, two parity checks with two redundant disks, will suffice. However, when a particularly high premium is placed upon data integrity, an additional, second diagonal parity check requiring a third redundant disk drive can be added to the disk drive array. The addition of this third redundant disk drive provides for the detection and correction of errors resulting from two disk drive failures.

In accordance with the present invention, the "read out" parity checks, termed "error syndromes" are generated as follows. With $Z_m(n)$ denoting the "read out" bit value corresponding to the recorded bit $Z_m(n)$, the m-th vertical parity check yields the error syndrome:

$$S_{vm} = \sum_{n=0}^{N+1} Z_m(n) \tag{4}$$

The m-th diagonal with positive slope parity check yields the error syndrome:

$$S_{d(+)m}(0) = \sum_{n=0}^{N} Z_{m-n}(n) \tag{5}$$

The m-th diagonal with negative slope parity check yields the error syndrome:

$$S_{d(-)m}(N) = \sum_{n=0}^{N} Z_{m-n}(N-n) \tag{6}$$

If it is assumed that era(n) represents the error pattern corresponding to the "read out" bit value $Z_m(n)$, then $Z_m(n)$ can be written as:

$$Z_m(n) = Z_m(n) + e_m(n) \tag{7}$$

where+ is exclusive or. The error syndromes for bit position m can then be expressed as $$S_{vm} = \sum_{n=0}^{N+1} [Z_m(n) + e_m(n)] \tag{8}$$

$$S_{d(+)m} = \sum_{n=0}^{N} [Z_{m-n}(n) + e_{m-n}(n)] \tag{9}$$

$$S_{d(-)m} = \sum_{n=0}^{N} [Z_{m-n}(N-n) + e_{m-n}(N-n)] \tag{10}$$

Therefore, by combining equations 1 and 8, 2 and 9, and 3 and 10, it is possible to express the error syndromes in terms of the error patterns.

$$S_{vm} = \sum_{n=0}^{N+1} e_m(n) \tag{11}$$

$$S_{d(+)m} = \sum_{n=0}^{N} e_{m-n}(n) \tag{12}$$

$$S_{d(-)m} = \sum_{n=0}^{N} e_{m-n}(N-n) \tag{13}$$

In the absence of an error, all error syndrome values are zero. Conversely, any non-zero error syndrome value indicates the presence of an error.

Following the identification of data errors, the present invention provides for their correction. Error correction requires the regeneration of the proper data values to replace the corrupted data values. Data regeneration is accomplished by utilizing the "read in" parity checks and the remaining, uncorrupted data to reconstruct the proper data values for the affected bit positions. The regenerated data then replaces the corrupted data. In the event that a particular disk drive has experienced substantial failure, as described earlier, repeated corruption of the data is detected. In such an event, the user of the system is signalled, and the disk drive is replaced with a fresh disk. The proper data is then recreated on the replacement disk drive using the "read in" parity checks and the uncorrupted data. Following correction of data errors, the error syndrome values are modified to reflect the correction.

Figure 2:
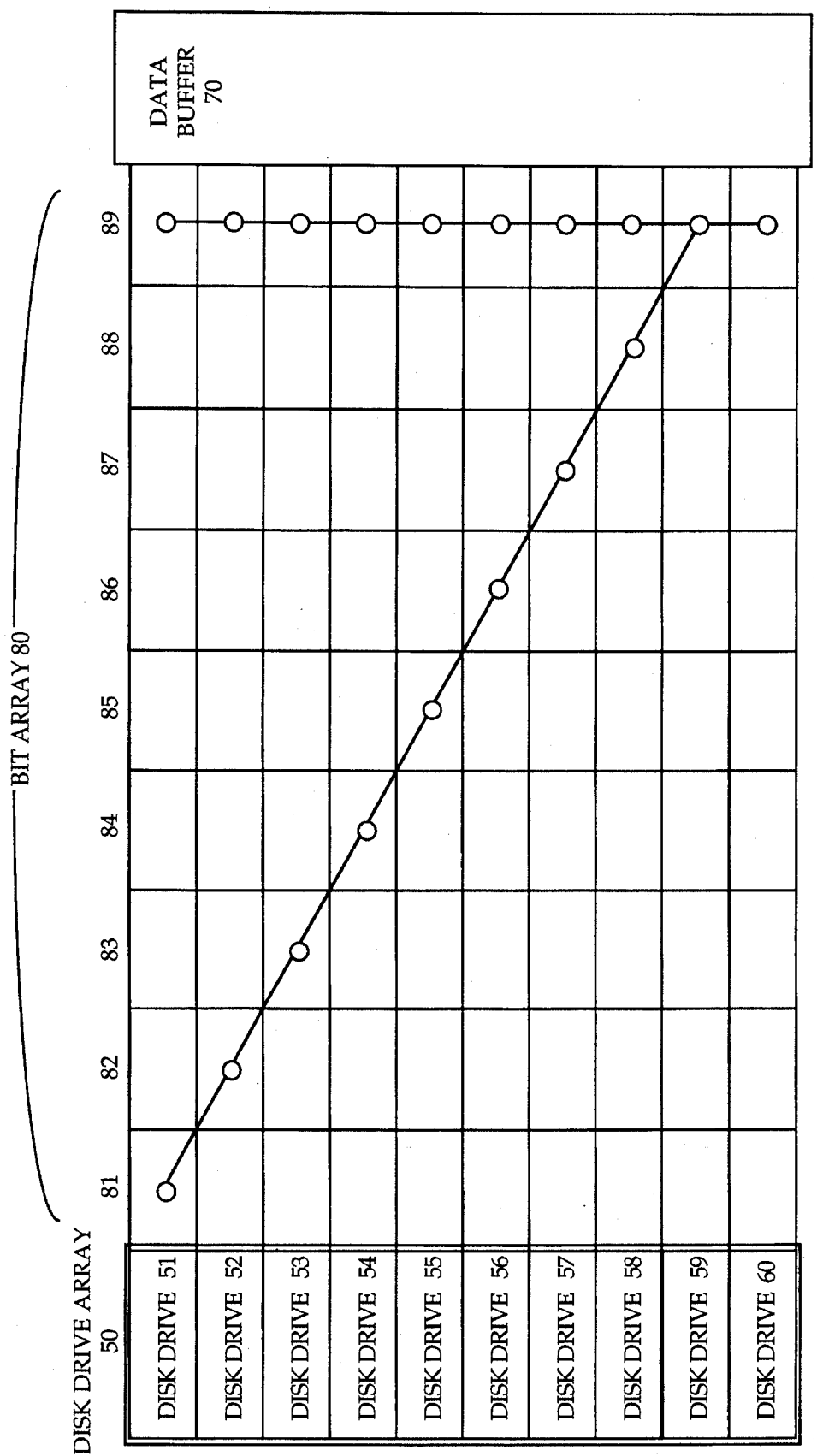
FIG. 2 illustrates a first embodiment of the present invention.

Referring to FIG. 2, the application of the present invention to a disk drive array having two redundant disk drives is illustrated. As shown in this figure, a data buffer 70 is coupled to a disk drive array 50 comprising a plurality of disk drives. In particular, disk drive array 50 comprises disk drives 51–58 for the parallel storage of successive bytes of data. Disk drives 59 and 60 are redundant disk drives and store parity check bits. Two dimensional bit array 80 represents an expanded view of a bit stream as it is being coupled between disk drive array 50 and data buffer 70. Across the top of two dimensional bit array 80, the designations 81 to 89 correspond to time slots, each time slot reflecting a clock cycle, while across the left side of the two dimensional bit array 80 separate bit channels are illustrated for each of the disk drives in disk drive array 50.

Continuing to refer to FIG. 2, disk drive 59 stores successive negative slope diagonal parity check bits, while disk drive 60 stores successive vertical parity check bits. When data is read out of disk drives 51 thru 58, corresponding "read out" parity checks are performed on the data, and "error syndromes" as described earlier are obtained. From these "error syndromes," any data errors can be detected. Once data errors are detected, the proper data values are regenerated using the "read in" parity check bits and the remaining, uncorrupted data.

Figure 3:
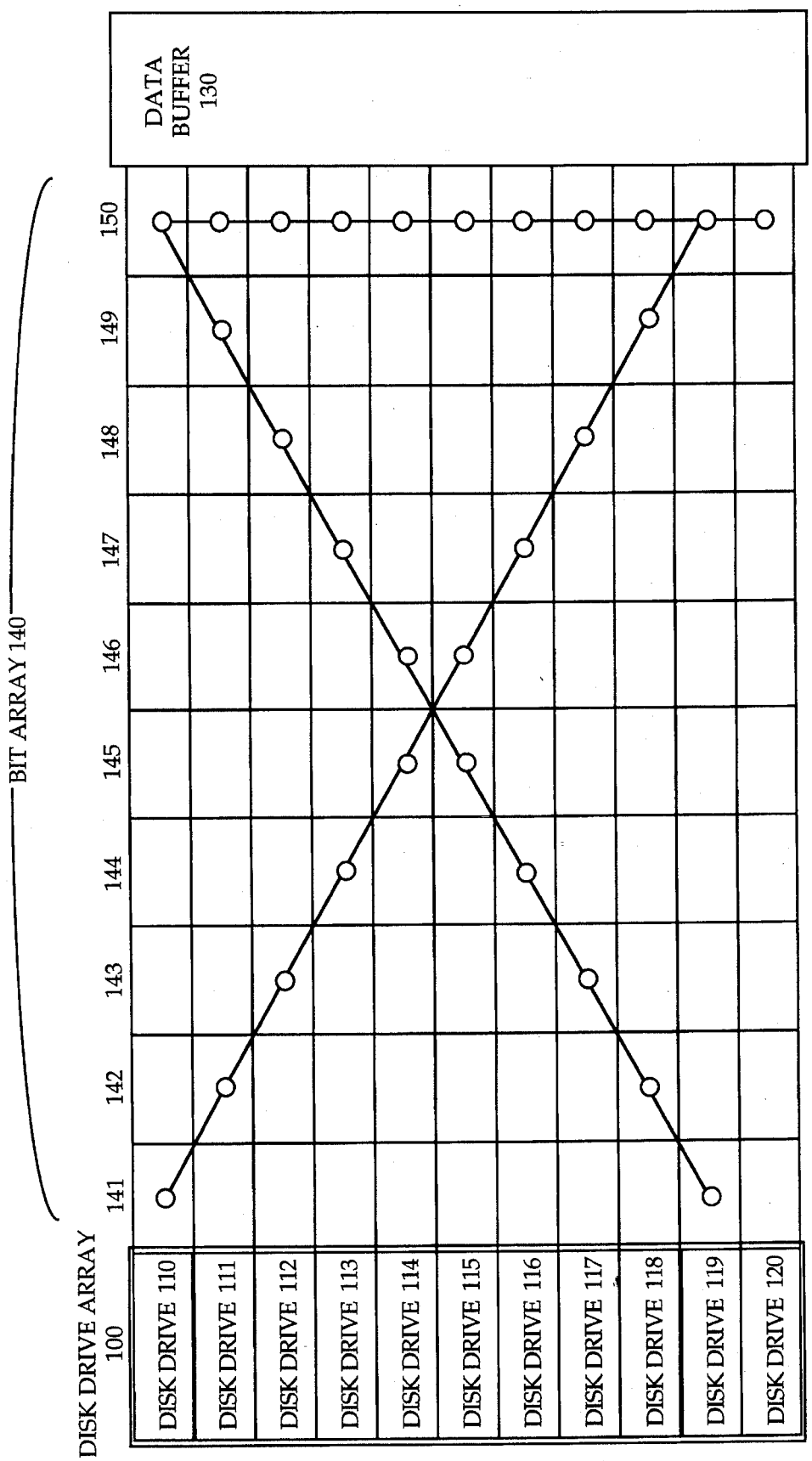
FIG. 3 illustrates a second embodiment of the present invention.

Referring now to FIG. 3, this figure illustrates the application of the present invention to a disk drive array having three redundant disk drives. As illustrated in this figure, a data buffer 130 is coupled to a disk drive array 100 comprising a plurality of disk drives. In particular, disk drive array 100 comprises disk drives 111 to 118 for the parallel storage of successive bytes of data. Redundant disk drives 110, 119, and 120 are used for the storage of parity check bits. Two dimensional bit array 140 represents an expanded view of a bit stream as it is being coupled between disk drive array 100 and data buffer 130. Across the top of the two dimensional bit array 140, the designations 141 to 150 correspond to time slots, each time slot representing a clock cycle, while in the vertical direction of two dimensional bit array 140 separate bit channels are illustrated for each disk drive in disk drive array 100.

With reference to FIG. 3, disk drive 110 stores successive positive slope diagonal parity check bits. Disk drive 119 stores successive negative slope diagonal parity check bits, while disk drive 120 stores successive vertical parity check bits. When data is read out of disk drives 111 to 118, corresponding "read out" parity checks are performed on the data. The "error syndromes" as described earlier are obtained. From these "error syndromes," data errors are detected and corrected using "read in" parity check bits and the remaining, uncorrupted data.

It will be appreciated that certain subtle reliability problems in systems such as those shown in FIGS. 2 and 3 can occur which are unique to disk drive arrays. For example, a pair of disk drives might be inadvertently exchanged. Alternatively, it is possible that a given disk drive will not be functional when the data is written onto the disk, but regain functionality when the data is read back. In such "exchange" or "failure to write" scenarios, a CRC check sum will be reported as correct, but the data will essentially be "worthless" for reconstructing this particular block of data. Accordingly, the present invention further encodes with each block of data, on each disk drive, each time a write occurs:

(1) An array ID that is unique for all systems between which units might be exchanged.

(2) An ID identifying the disk position within the array.

(3) A unique sequencing stamp. This can be a monotonously increasing number for each write on a given array, or date/time stamp with the resolution finer than the fastest time required to "exchange" or "turn off and back on" a drive.

As with the parity checks, this additional identification stamping can be done in real time on the fly.

Figure 4A:
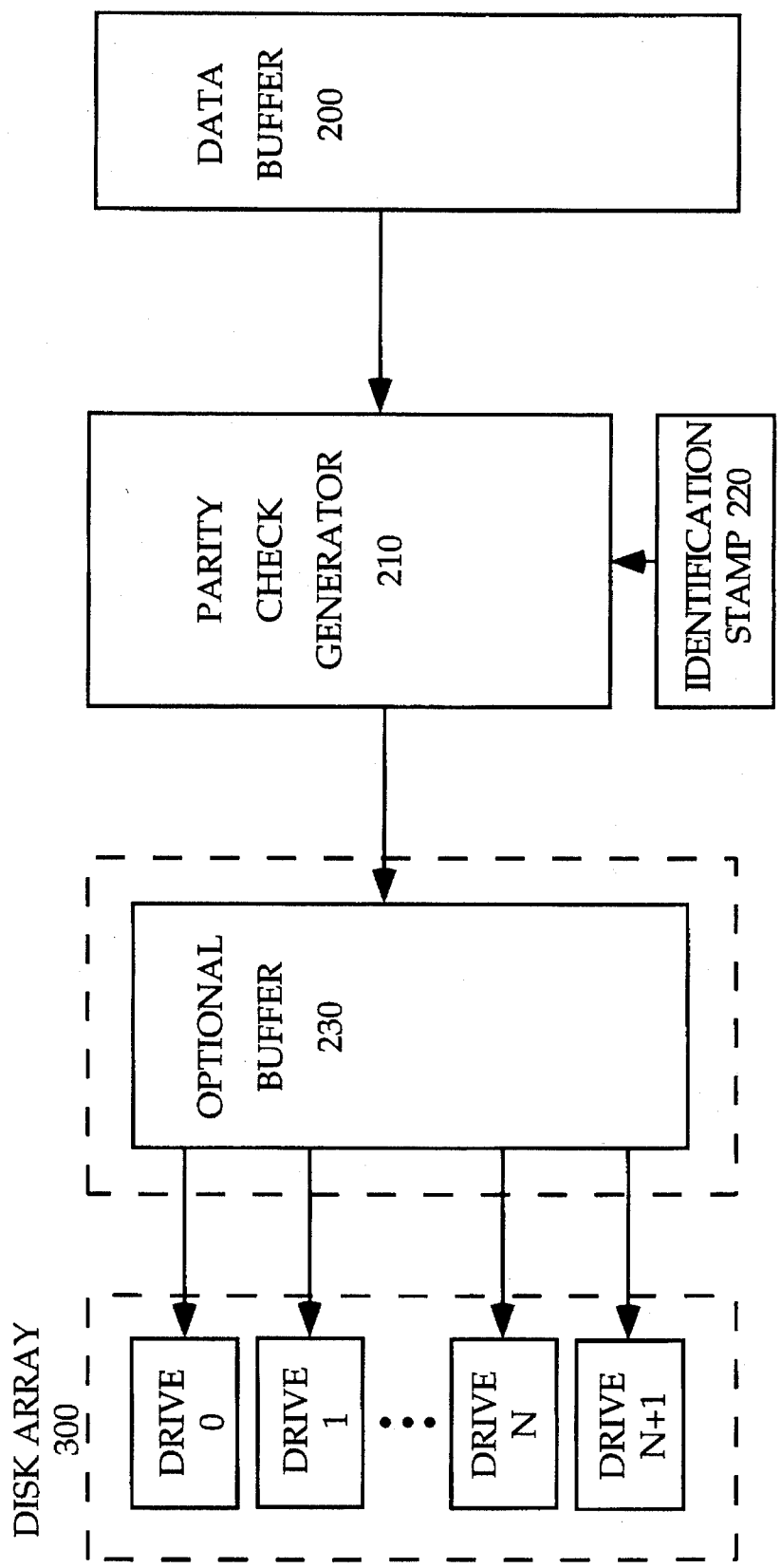
FIGS. 4A and 4B illustrate in block diagram form, an embodiment of a hardware implementation of the present invention.
Figure 4B:
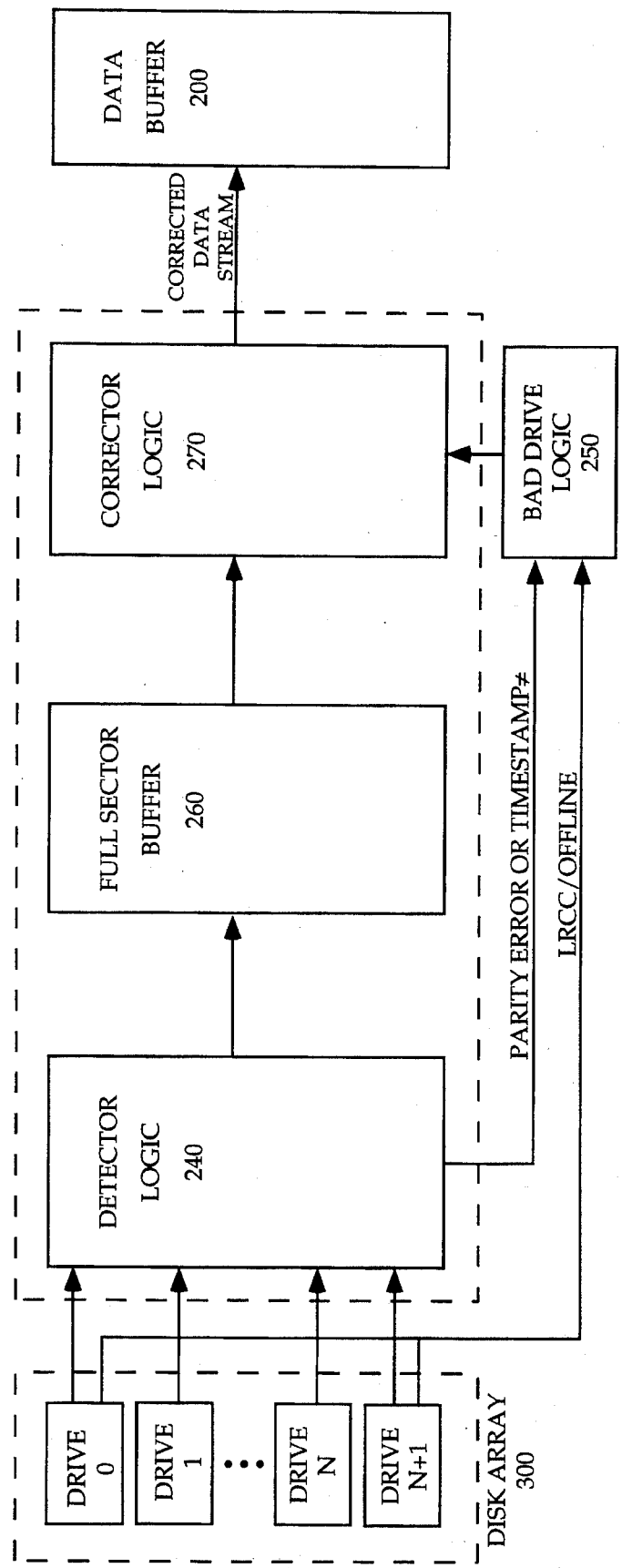

Referring now to FIGS. 4A and 4B, these figures illustrate in block diagram form, a hardware implementation of the present invention. This implementation can be comprised of ASIC. In particular, FIG. 4A illustrates the hardware implementation for a write (or "read in") of the disk drive array, while FIG. 4B depicts the hardware implementation of a read (or "read out"). Referring first to FIG. 4A, data is initially coupled from data buffer 200 to parity check generator 210. Parity check generator 210 performs the parity checks previously described in equations (1), (2), and (3). Parity check generator 210 comprises a single level of logic (for example, NAND and NOR gates) and thereby generates parity checks in real time. An identification stamp unit 220 further writes identification designations on the data. The data is then coupled to an optional buffer 230 which stripes the data according to the desired packet size and the number of disk drives in disk drive array 300. Optional buffer 230 is also implemented in ASIC logic. The striped data is then coupled to and stored in disk drive array 300.

Referring now to FIG. 4B, in a read (or "read out") from the disk drive array 300, the data is coupled from the disk drive array 300 to detector logic 240. Detector logic 240 generates the error syndromes previously described in equations (4), (5), and (6). Detector logic 240 is again, comprised of a single level of logic, including for example, NAND and NOR gates, and generates these error syndromes in real time. In the event that detector logic 240 detects either a parity check error, or an identification error, a corresponding signal is coupled to bad drive logic 250, which in turn, couples a corresponding signal to error corrector logic 270. Error corrector logic 270 is thereby informed that error correction will be required.

Error corrector logic 270, utilizes the results of equations (1) to (13), as well as the remaining, uncorrupted data, to correct the corrupted data. Error corrector logic 270 comprises logic including NAND gates, NOR gates, latches, and registers. A full sector buffer 260 serves as a buffer between the detector logic 240 and the corrector logic 270. A sector of data comprises a standardized block of data, for example, 1 KB or 4 KBs, depending upon the format of the disk drives used in the disk drive array 200. Following error correction, the corrected data is coupled to data buffer 200.

Thus, the present invention, unlike the prior art, accomplishes error detection and correction in real time in hardware. There are no delays between the real data stream and the generation of parity bits, as these are generated on the fly in real time. Moreover, in contrast to the previously described mirroring method of insuring data integrity, the present invention minimizes the number of redundant disk drives. In the present invention, even in those disk drive arrays having substantial numbers of disk drives, only two or three redundant disk drives are utilized to insure fault tolerance.

While the present invention has been particularly described with reference to FIGS. 1 through 4B, and with emphasis on a certain number of disks in a disk drive array, it should be understood that the figures are for illustration only and should not be taken as limitations upon the invention. It is further contemplated that many changes and modifications may be made to the invention, by one of ordinary skill in the art, without departing from the spirit and scope of the invention as disclosed herein. In particular, while the present invention has been described as advantageously implemented in hardware, it will be appreciated that the present invention may also be implemented in computer software.

We claim:

1. A fault tolerant disk drive system comprising:

a first plurality of disk drive devices for storing data;

means for performing a first plurality of parity checks including a plurality of vertical parity checks, and a plurality of diagonal parity checks on data coupled to said first plurality of disk drive devices;

a second plurality of disk drive devices for storing results of said first plurality of parity checks;

means for performing a second plurality of parity checks including a plurality of vertical parity checks and a plurality of diagonal parity checks on said data in the event said data is outputted from said first plurality of disk drive devices;

means for comparing results from said first plurality of parity checks and said second plurality of parity checks and generating comparison results;

means for utilizing the comparison results and unaffected data to detect and correct data errors.

2. The fault tolerant disk drive system as provided in claim 1 wherein said means for performing a first plurality of parity checks performs a plurality of vertical parity checks and a plurality of positive slope diagonal parity checks on data coupled to said first plurality of disk drive devices.

3. The fault tolerant disk drive system as provided in claim 2 wherein said means for performing a second plurality of parity checks performs a plurality of vertical parity checks and a plurality of positive slope diagonal parity checks on data outputted from said first plurality of disk drive devices.

4. The fault tolerant disk drive system as provided in claim 3 wherein said means for performing a first plurality of parity checks additionally performs a plurality of negative slope diagonal parity checks on data coupled to said first plurality of disk drive devices.

5. The fault tolerant disk drive system as provided in claim 4 wherein said means for performing a second plurality of parity checks additionally performs a plurality of negative slope diagonal parity checks on data outputted from said first plurality of disk drive devices.

6. The fault tolerant disk drive system as provided in claim 1, further comprising a means for identification stamping each block of said data on each said disk drive each time a write occurs, said identification stamping to be used to overcome reliability problems in said disk drive array.

7. A method for detecting corrupted data in a disk drive array, said disk drive array comprising a plurality of data disk drives, said method comprising the steps of:

coupling a plurality of data bits in parallel to said plurality of data disk drives;

performing a first plurality of read-in parity checks on said plurality of data bits, said first plurality of read-in parity checks comprises a plurality of read-in vertical parity checks;

performing a second plurality of read-in parity checks on said plurality of data bits, said second plurality of read-in parity checks comprises a plurality of read-in diagonal parity checks;

storing said plurality of data bits in said plurality of data disk drives;

outputting said plurality of data bits from said plurality of data disk drives;

performing a first plurality of read-out parity checks on said plurality of data bits outputted from said plurality of disk drives, said first plurality of read-out parity checks comprises a plurality of read-out vertical parity checks;

performing a second plurality of read-out parity checks on said plurality of data bits outputted from said plurality of disk drives, said plurality of read-out parity checks comprises a plurality of read-out diagonal parity checks;

utilizing results of said first plurality of read-in parity checks, said second plurality of read-in parity checks, said first plurality of read-out parity checks, and said second plurality of read-out parity checks to detect corrupted data; and identification stamping each block of said data bits of each said data disk drives each time a write occurs, said identification being used to overcome reliability problems occurring in said disk drive array.

8. The method for detecting corrupted data as provided in claim 7 further comprising the steps of:

storing the results of said first plurality of read-in parity checks in a first redundant disk drive, said first redundant disk drive being one of said plurality of data disk drives;

storing the results of said second plurality of read-in parity checks in a second redundant disk drive, said second redundant disk drive being one of said plurality of data disk drives.

9. The method for detecting corrupted data as provided in claim 8 wherein said first plurality of read-in parity checks comprises a plurality of read-in vertical parity checks and said second plurality of read-in parity checks comprises a plurality of read-in positive slope diagonal parity checks.

10. The method for detecting corrupted data as provided in claim 9 wherein said first plurality of read-out parity checks comprises a plurality of read-out vertical parity checks and said second plurality of read-out parity checks comprises a plurality of read-out positive slope diagonal parity checks.

11. The method for detecting corrupted data as provided in claim 10 further comprising the steps of:

performing a third plurality of read-in parity checks on said plurality of data bits;

storing results of said third plurality of read-in parity checks in a third redundant disk drive, said third redundant disk drive being one of said plurality of data disk drives;

performing a third plurality of read-out parity checks on said plurality of data bits output from said plurality of disk drives;

wherein said step of utilizing the results additionally utilizes the results of said third plurality of read-in parity checks and said third plurality of read-out parity checks.

12. The method for detecting corrupted data as provided in claim 11 wherein said step of performing a third plurality of read-in parity checks on said plurality of data bits comprises a plurality of read-in negative slope diagonal parity checks and said third plurality of read-out parity checks comprises a plurality of read-out negative slope diagonal parity checks.

13. A method for locating a corrupted data in N data disk drives, in a system comprising data disk drives, data buffer means having a corresponding number N output channels for providing data to said N data disk drives, and first and second redundant disk drives among said N data disk drives, said method comprising the steps of:

outputting a first column of N data bits from said data buffer means;

performing a first read-in vertical parity check on said first column of N data bits;

storing said first column of N data bits in said N data disk drives;

storing result of said first read-in vertical parity check in said first redundant disk drive;

outputting a second column of N data bits from said data buffer means;

performing a read-in diagonal parity check on a bit in a first channel of said first column of N data bits;

performing a second read-in vertical parity check on said second column of N data bits and result of said read-in diagonal parity check;

storing said second column of N data bits in said N data disk drives;

storing result of said second read-in vertical parity check in said first redundant disk drive;

storing the result of said read-in diagonal parity check in said second redundant disk drive;

reading out said first column of N data bits from said N data disk drives;

reading out said result of said first read-in vertical parity check from said first redundant disk drive;

performing a first read-out vertical parity check on said first column of N data bits read out from said N data disk drives;

reading out said second column of N data bits from said N data disk drives;

reading out said result of said second read-in vertical parity check from said first redundant disk drive;

reading out said result of said read-in diagonal parity check from said second redundant disk drive;

performing a second read-out vertical parity check on said second column of N data bits read out from said N data disk drives;

performing a read-out vertical parity check on a bit in said first channel of said first column of N data bits read out from said N data disk drives;

utilizing the results of said first read-in vertical parity check, said first read-out vertical parity check, said second read-in vertical parity check, said second read-out vertical parity check, said read-in vertical parity check, and said read-out vertical parity check to locate corrupted data in said N data disk drives.

* * * * *